United States Patent [19]
Suganuma et al.

[11] Patent Number: 5,507,023
[45] Date of Patent: Apr. 9, 1996

[54] RECEIVER WITH AN AGC CIRCUIT CAPABLE OF EXPANDING A DYNAMIC RANGE

[75] Inventors: Gen Suganuma; Yukihiko Kumagai; Kenji Higaki, all of Mitaka, Japan

[73] Assignee: Japan Radio Co., Ltd., Tokyo, Japan

[21] Appl. No.: 446,032

[22] Filed: Jun. 1, 1995

Related U.S. Application Data

[63] Continuation of Ser. No. 174,155, Dec. 27, 1993, abandoned.

[30] Foreign Application Priority Data

Jul. 29, 1993 [JP] Japan .................... 5-188276

[51] Int. Cl.$^6$ .................................. H04B 1/06
[52] U.S. Cl. .................. 455/234.1; 455/249.1; 455/250.1; 330/138; 375/345
[58] Field of Search ............... 455/234.1, 235.1, 455/232.1, 239.1, 240.1, 241.1, 249.1, 250.1, 251.1, 253.2, 341; 375/345; 330/138, 280

[56] References Cited

U.S. PATENT DOCUMENTS

| | | | |
|---|---|---|---|
| 4,227,256 | 10/1980 | O'Keefe | 455/250.1 |
| 4,455,681 | 6/1984 | Wile. | |
| 4,581,589 | 4/1986 | Ikoma | 330/138 |
| 4,742,565 | 5/1988 | Iwahashi | 455/250.1 |
| 4,745,365 | 5/1988 | Ugenti. | |
| 5,184,349 | 2/1993 | Riordan | 455/250.1 |
| 5,303,268 | 4/1994 | Tsutsumi et al. . | |

OTHER PUBLICATIONS

Patent Abstracts of Japan, vol. 15, No. 9 (E-1021) Jan. 9, 1991 & JP-A-02 261 223 (NEC Corp.) Oct. 24, 1990 Abstract.

Patent Abstracts of Japan, vol. 15, No. 86 (E-1039) Feb. 28, 1991 & JP-A-02-301 209 (NEC Corp.) Dec. 13, 1990— Abstract.

Primary Examiner—Reinhard J. Eisenzopf
Assistant Examiner—Doris To
Attorney, Agent, or Firm—Frishauf, Holtz, Goodman, Langer & Chick

[57] ABSTRACT

A receiver comprises an AGC circuit including a low noise amplifier for amplifying a reception input signal and an AGC amplifier, a level detection circuit for producing a strength indication signal indicative of an input field strength, and a demodulator. The receiver has a function of controlling a gain to keep an amplitude of a demodulator input signal at a constant level. A bias control circuit controls on and off of a bias voltage source to allow and inhibit supply of a bias voltage to the low noise amplifier when the strength indication signal has a signal level lower than and not lower than a first threshold level, respectively. When the signal level is thereafter decreased to a second threshold level lower than the first threshold level, the bias control circuit turns on the bias voltage source to supply the bias voltage. A level output circuit serves to keep the strength indication signal at a predetermined high level when the bias voltage source is turned off.

4 Claims, 5 Drawing Sheets

| BIT PATTERN | INPUT FIELD STRENGTH |
|---|---|
| 00000 | −113 dBm or less |
| 00001 | −111 dBm |
| 00010 | −109 dBm |
| 00011 | −107 dBm |
| ⋮ | ⋮ |
| 11110 | −53 dBm |
| 11111 | −51 dBm or more |

FIG. 2     PRIOR ART

RECEIVER WITH AN AGC CIRCUIT CAPABLE OF EXPANDING A DYNAMIC RANGE

This application is a Continuation of application Ser. No. 08/174,155, filed Dec. 27, 1993, now abandoned.

BACKGROUND OF THE INVENTION

This invention relates to a receiver for use in a digital communication system and, in particular, to a receiver with an AGC (Automatic Gain Control) circuit for controlling a gain so as to keep an average amplitude of a demodulator input signal at a constant level.

Among a wide variety of digital communication systems, a US digital cellular system, for example, is known as a digital communication system using a modulated signal modulated in a QPSK (π/4 quadrature phase shift keying) modulation system. In a receiver for use in the digital communication system of the type described, a demodulator input signal supplied to a demodulator must have an average amplitude kept at a constant level and be free from distortion. Otherwise, a reception input signal can not be correctly demodulated. It is therefore required to keep the average amplitude of the demodulator input signal at a constant level even if a reception input level or an input field strength is fluctuated due to fading or the like. To this end, the receiver of the type described comprises an AGC circuit including a low noise amplifier connected to a reception antenna and an AGC amplifier located at an input side of the demodulator.

In such a conventional receiver with an AGC circuit, however, the AGC amplifier is saturated when the input field strength is increased. This is because the low noise amplifier has a high gain. In this event, distortion is caused in the demodulator input signal. As a consequence, the demodulator can not normally operate so that a demodulated signal inevitably contains an error.

Taking an economical efficiency into account, the AGC amplifier is allowed to have a dynamic range as wide as about 70 dB at most. Thus, the AGC amplifier is normally operable at the input field strength between −115 dBm and −45 dBm. When the input field strength is higher than −45 dBm beyond the above-mentioned range of the AGC amplifier, the average amplitude is fluctuated. In order to avoid fluctuation of the average amplitude, the AGC amplifier must have a high saturation level and a wide dynamic range. This inevitably increases the scale of the AGC circuit and the amount of electric current supplied thereto. It is therefore difficult to efficiently realize a high saturation level and a wide dynamic range.

SUMMARY OF THE INVENTION

It is therefore an object of this invention to provide a receiver with an AGC circuit capable of expanding a dynamic range of an AGC amplifier in response to variation of an input field strength.

A receiver to which this invention is applicable comprises an AGC circuit which includes a low noise amplifier for amplifying a reception input signal and an AGC amplifier connected to the low noise amplifier for producing an amplified signal as a demodulator input signal and which controls a gain so as to keep an average amplitude of the demodulator input signal at a constant level, and detecting means connected to the low noise amplifier and supplied with an output signal of the low noise amplifier for detecting an input field strength to produce a strength indication signal indicative of the input field strength. According to this invention, the receiver further comprises a bias control circuit connected to the detecting means for supplying a bias voltage from a bias voltage source to the low noise amplifier when the strength indication signal has a signal level lower than a predetermined first threshold level, interrupting supply of the bias voltage when the signal level increasingly reaches the first threshold level, and allowing supply of the bias voltage when the signal level is thereafter decreased to a predetermined second threshold level lower than the first threshold level, and a level output circuit connected to the bias control circuit for keeping the strength indication signal at a predetermined high level when supply of the bias voltage is interrupted.

BRIEF DESCRIPTION OF THE DRAWING

FIG. 2 shows an example of an indication pattern of an input field strength in the receiver with an AGC circuit illustrated in FIG. 1;

DESCRIPTION OF THE PREFERRED EMBODIMENT

Figure 1:
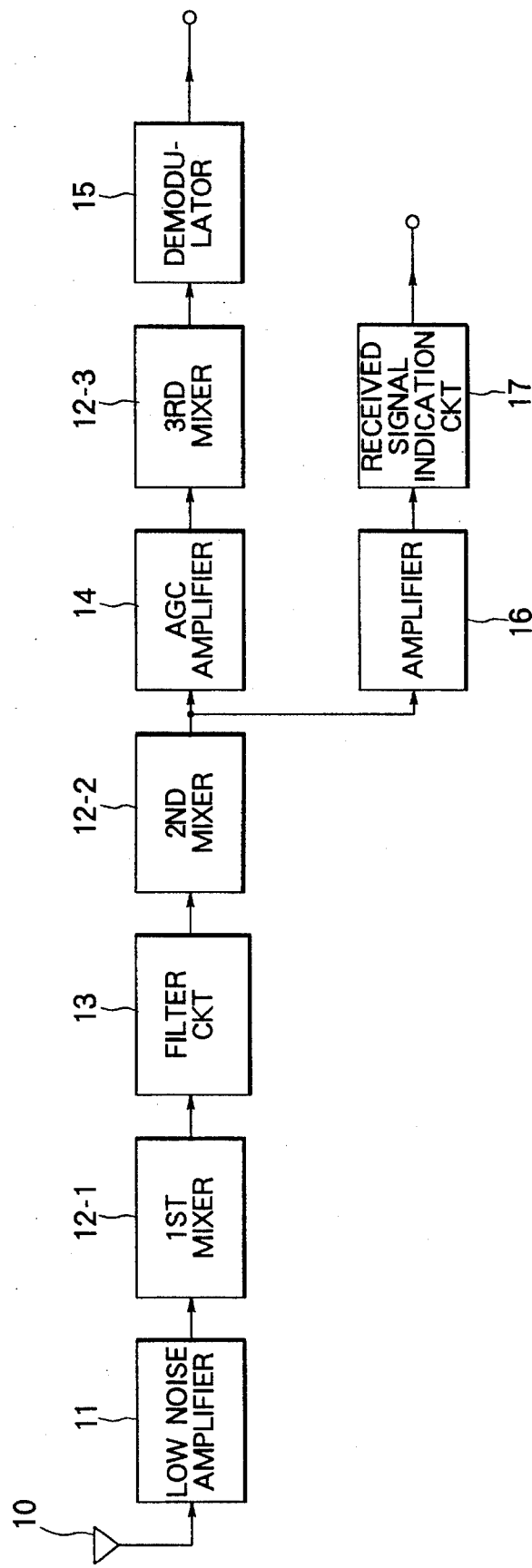
FIG. 1 is a block diagram of a conventional receiver with an AGC circuit.

Referring to FIG. 1, a conventional receiver with an AGC circuit will at first be described in order to facilitate an understanding of this invention. The receiver with an AGC circuit comprises a reception antenna 10, a low noise amplifier 11 connected to the reception antenna 10, a first mixer 12-1, a filter circuit 13, a second mixer 12-2, an AGC amplifier 14, a third mixer 12-3, a demodulator 15, an amplifier 16, and an RSSI (Received Signal Strength Indicator) circuit 17.

An RF input signal is received through the reception antenna 10, amplified by the low noise amplifier 11, and converted by the first mixer 12-1 into a first IF (Intermediate Frequency) signal. The first IF signal is supplied to the filter circuit 13 through which an undesired wave component in the first IF signal is attenuated. The first IF signal is then converted by the second mixer 12-2 into a second IF signal which is supplied to the AGC amplifier 14. Supplied with the second IF signal, the AGC amplifier 14 automatically controls a gain to produce a gain controlled signal having an average amplitude kept at a constant level. The gain controlled signal is supplied to a third mixer 12-3. The third mixer 12-3 converts the gain controlled signal into a baseband signal which is supplied to the demodulator 15 as a demodulator input signal. The demodulator 15 demodulates the demodulator input signal into a demodulated digital data signal. When the average amplitude of the demodulator input signal is not constant and distortion is caused in the demodulator input signal, the demodulated digital data signal inevitably contains an error.

On the other hand, the second IF signal is also supplied to the amplifier 16 and amplified into an amplified signal. The amplified signal is supplied to the RSSI circuit 17. The RSSI circuit 17 serves as a detection circuit for detecting an input field strength of the amplified signal. The RSSI circuit 17 produces a strength indication signal indicative of the input field strength as a voltage level. In the US digital cellular system, the RSSI circuit 17 is required to report the input field strength to a base station in the form of a bit pattern as illustrated in FIG. 2.

Referring to FIG. 2, bit patterns "00000" through "11111" represent input field strengths at every predetermined interval (2 dBm in FIG. 2).

Figure 3:
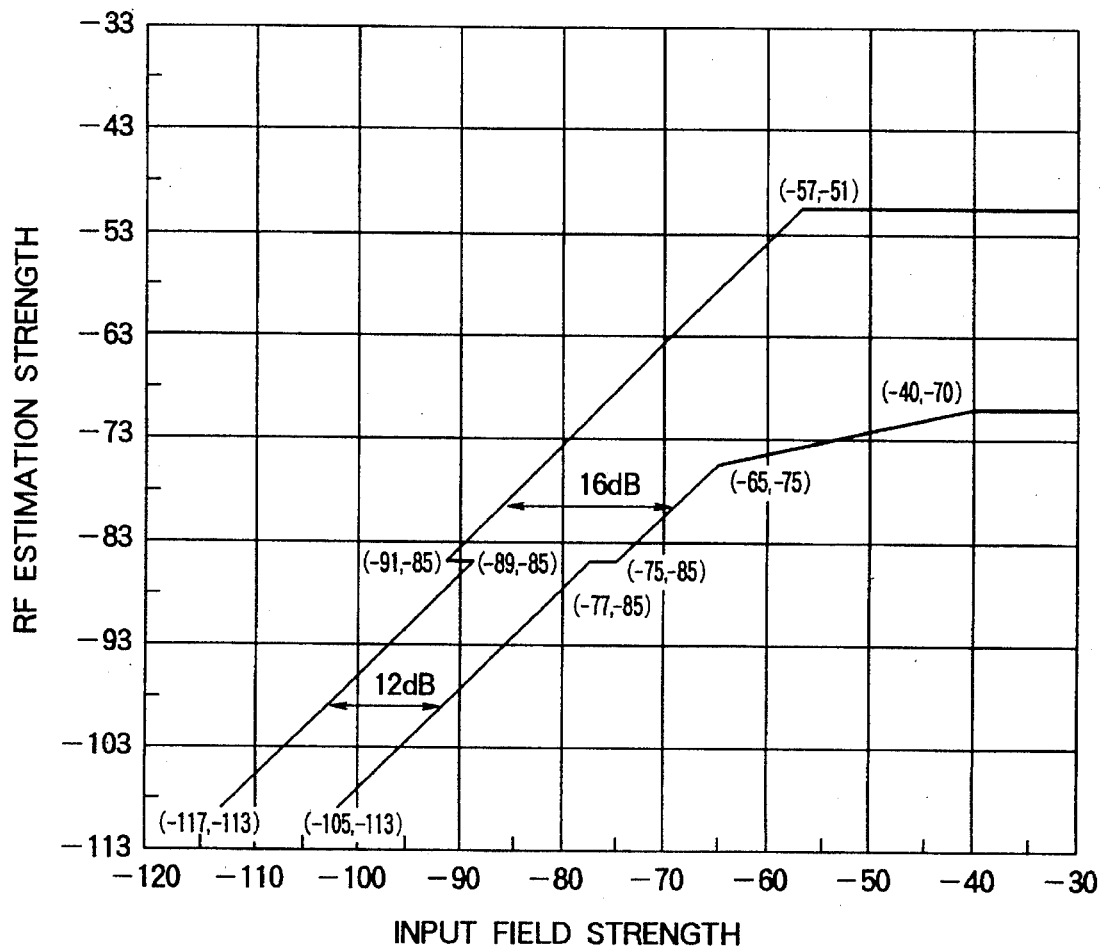
FIG. 3 is a characteristic chart representative of a relationship between the input field strength and an RF estimation strength in the receiver with an AGC circuit illustrated in FIG. 1.

Referring to FIG. 3, a characteristic representative of the relationship between the input field strength and an RF estimation strength must be linearly varied within a range between −113 dBm and −51 dBm.

In the above-mentioned conventional receiver with an AGC circuit, however, the second mixer 12-2 and the AGC amplifier 14 are saturated when the input field strength is increased. This is because the low noise amplifier 11 and the first mixer 12-1 have a high gain. In this event, distortion is caused in the demodulator input signal. As a consequence, the demodulator 15 can not normally operate so that the demodulated digital data signal inevitably contains an error.

Taking an economical efficiency into consideration, the AGC amplifier 14 is allowed to have a dynamic range of the order of 70 dB at most. Thus, the AGC amplifier 14 is normally operable at the input field strength within a range between −115 dBm and −45 dBm. When the input field strength is higher than −45 dBm beyond the above-mentioned range of the AGC amplifier 14, the average amplitude is fluctuated. In order to avoid fluctuation of the average amplitude, the second mixer 12-2 and the AGC amplifier 14 must have an increased saturation level. The AGC amplifier 14 must have a wide dynamic range. This results in a large-scale AGC circuit and an increased amount of electric current supplied thereto. It is therefore difficult to efficiently realize a high saturation level and a wide dynamic range.

Figure 4:
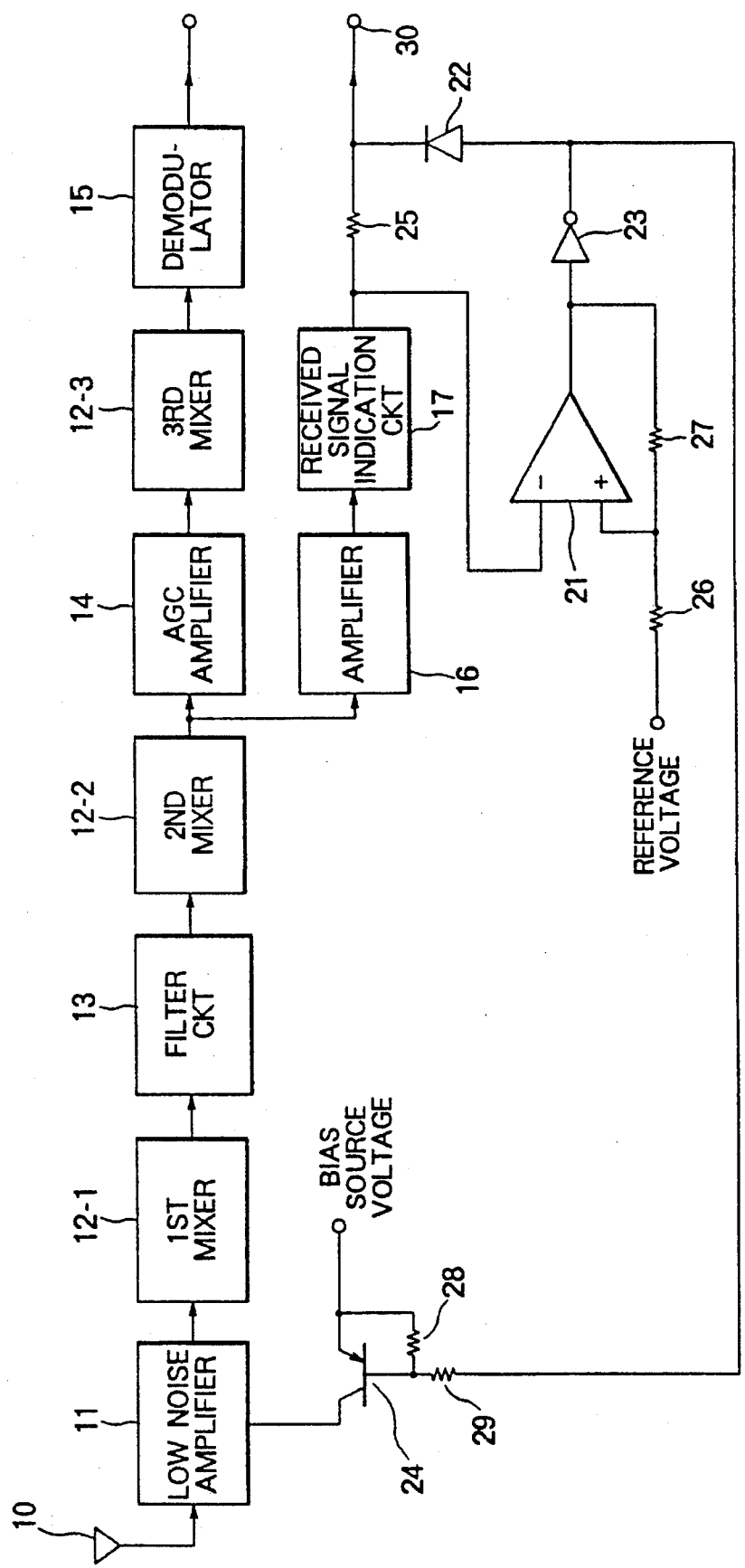
FIG. 4 is a block diagram for describing a receiver with an AGC circuit according to one embodiment of this invention.

Referring to FIG. 4, description will now be made as regards a preferred embodiment of this invention. In FIG. 4, similar parts are designated by like reference numerals and will not be described any longer. A receiver with an AGC circuit according to this invention comprises the circuitry illustrated in FIG. 1 and an additional circuit connected between the low noise amplifier 11 and an output side of the RSSI circuit 17. The additional circuit comprises a comparator 21 having a hysteresis characteristic, a diode 22, an inverter 23, a switching transistor 24 connected to a bias voltage source, a resistor 25 connected to the output side of the RSSI circuit 17, resistors 26 and 27 connected to the comparator 21, and resistors 28 and 29 connected to the switching transistor 24.

The additional circuit is divided into a first circuit from the comparator 21 via the inverter 23 to the switching transistor 24, and a second circuit from the inverter 23 to the diode 22. The first circuit serves as a bias control circuit for controlling supply of the bias voltage to the low noise amplifier 11 by turning on and off the switching transistor 24 to connect and disconnect the bias voltage source. The second circuit serves as a level output circuit for keeping the strength indication signal, which is indicative of the input field strength as described in the foregoing, at a predetermined high level while the bias voltage is not supplied to the low noise amplifier 11.

Figure 5:
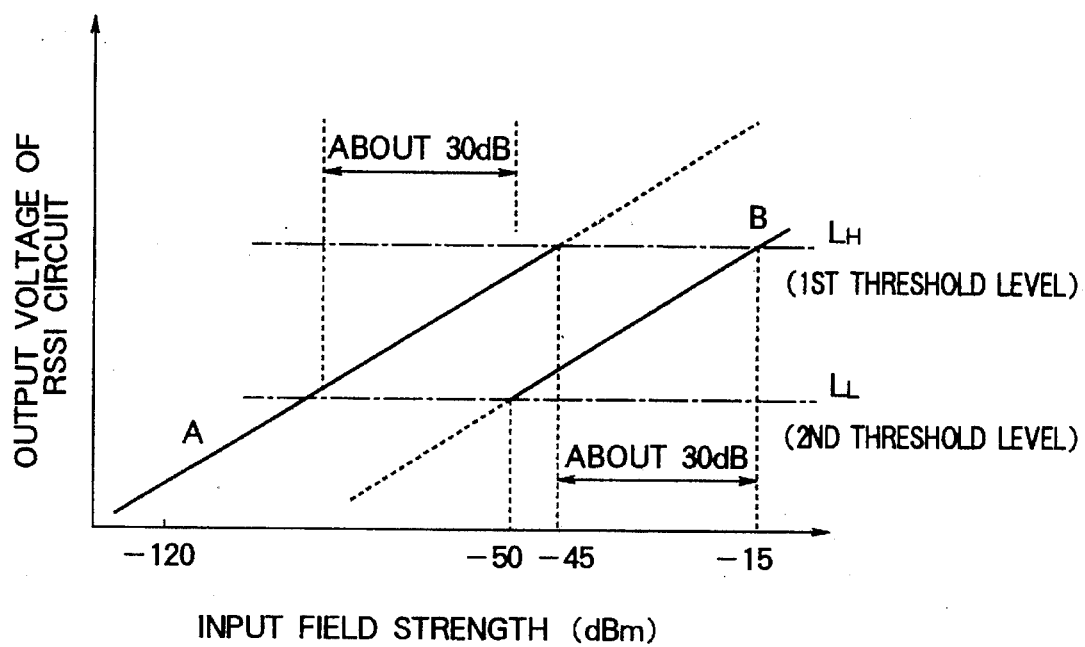
FIG. 5 is a characteristic chart representative of a relationship between an output voltage of an RSSI circuit and an input field strength in the receiver with an AGC circuit illustrated in FIG. 4.

Referring to FIG. 5 also, in the receiver with an AGC circuit according to this invention, the output voltage of the RSSI circuit 17, namely, the signal level of the strength indication signal is varied with an increase of the input field strength to exhibit a characteristic depicted by a line A in the figure. The comparator 21 has a first threshold level $L_H$ of a predetermined high level and a second threshold level $L_L$ ($L_H > L_L$) of a predetermined low level because of its hysteresis characteristic.

In this embodiment, when the input field strength is increased to −45 dBm, the output voltage of the RSSI circuit 17 increases to the first threshold level $L_H$. In this event, the comparator 21 produces a comparator output signal having a low (logic zero) level. Supplied with the comparator output signal having the low level, the inverter 23 produces an inverter output signal having a high (logic one) level to turn off the switching transistor 24. In this event, the low noise amplifier 11 is not supplied with the bias voltage so that the low noise amplifier 11 has an attenuation characteristic. Thus, the input level is reduced by 30 dB or so at the first mixer 12-1 and at each of the subsequent circuit components. Accordingly, the output voltage of the RSSI circuit 17 exhibits a characteristic depicted by a line B in FIG. 5. In other words, the output voltage of the RSSI circuit 17 exhibits a characteristic which is shifted from the line A to the line B when the output voltage increasingly reaches the first threshold level $L_H$.

As far as the characteristic depicted by the line A is followed, the AGC amplifier 14 is saturated when the output voltage of the RSSI circuit 17 reaches the first threshold level $L_H$. However, transition from the line A to the line B prevents the AGC amplifier 14 from being saturated even if the input field strength is still further increased by 30 dB or so, as will readily be understood from FIG. 5. Thus, by interrupting supply of the bias voltage to the low noise amplifier 11 to make the low noise amplifier 11 have the attenuation characteristic, the dynamic range of the AGC amplifier 14 is expanded by 30dB or so. It is noted that the characteristic of the line A is followed while the input field strength is between −115 dBm and −45 dBm.

Figure 6:
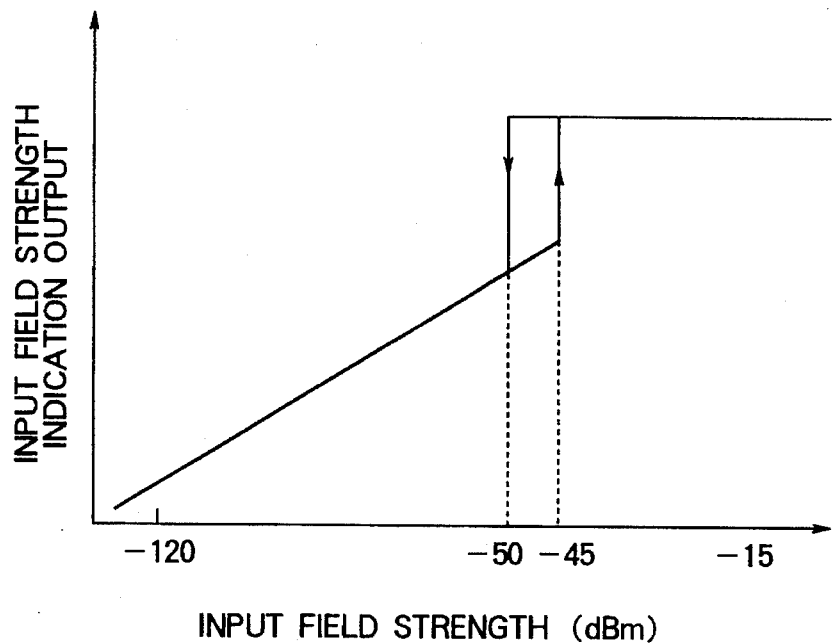
FIG. 6 is a characteristic chart representative of a relationship between the input field strength and an input field strength indication output in the receiver with an AGC circuit illustrated in FIG. 4.

Referring to FIG. 6, the output voltage of the RSSI circuit 17, namely, the signal level of the strength indication signal is decreased upon transition from the line A to the line B. However, the inverter 23 then produces the inverter output signal having a high level which is applied through the diode 22 to provide an input field strength indication signal. Thus, the input field strength indication signal has a predetermined high level. Therefore, such decrease of the output voltage of the RSSI circuit 17 is never misunderstood as a decrease of the input field strength. To the contrary, the output voltage of the RSSI circuit 17 is increased upon transition from the line B to the line A as will later be described in detail. However, the inverter output signal is then shifted from the high level to the low level so that no high level output signal of the inverter 23 is applied through the diode 22. Accordingly, the input field strength indication signal is no longer derived from the inverter output signal of a high level but now corresponds to the output voltage of the RSSI circuit 17. It is therefore possible to avoid misjudgement that the input field strength is increased.

According to this invention, interruption of supply of the bias voltage to the low noise amplifier 11 lowers the input level at each of the second mixer 12-2 and the AGC amplifier 14 by 30 dB or so. Even if the input field strength is further increased, the second mixer 12-2 and the AGC amplifier 14 are never saturated and the baseband signal produced from the third mixer 12-3 contains no distortion. It is assumed here that the AGC amplifier 14 is normally operable at the input field strength between −115 dBm and −45 dBm, namely, has an inherent dynamic range between −115 dBm and −45 dBm. According to this invention, the input level is lowered by 30 dB or so if the input level increases beyond −45 dBm. Accordingly, the dynamic range of the AGC amplifier 14 is apparently expanded over a range between −115 dBm and −15 dBm. As a consequence, the baseband signal produced from the third mixer 12-3 has an average amplitude which is kept constant at the input field strength up to −15 dBm. Accordingly, the demodulator 15 is supplied with a demodulator input signal having a constant average amplitude and no distortion even if the input field strength is high. Thus, the demodulator 15 can normally operate so that the demodulated digital data signal contains no error.

Next, it is assumed that the input field strength is decreased from the level higher than −45 dBm down to −50 dBm. The output voltage of the RSSI circuit 17 is decreased to the second threshold level $L_L$ of a predetermined low level. In this event, the comparator 21 produces the comparator output signal of the high level. As a consequence, the inverter 23 produces the inverter output signal of the low level to turn on the switching transistor 24. The bias voltage is then supplied to the low noise amplifier 11 so that the receiver with an AGC circuit carries out a normal operation. Specifically, when the output voltage of the RSSI circuit 17 is decreased to the second threshold level $L_L$, transition from the line B to the line A is caused. As illustrated in FIG. 6, upon transition from the line B to the line A, no high level output signal of the inverter 23 is applied through the diode 22. Thus, the output voltage of the RSSI circuit 17 is produced straightforward as the input field strength indication signal. It is therefore possible to avoid misjudgement that the input field strength is increased.

When the inverter output signal has the low level, high impedance is observed from an output terminal 30 of the input field strength indication signal because the diode 22 is connected to the inverter 23. This means that the input field strength indication signal has no influence of the inverter output signal having the low level. As a result, the strength indication signal of the RSSI circuit 17 is produced straightforward as the input field strength indication signal. It is therefore possible to correctly indicate the input field strength, for example, within a range between −113 dBm and −51 dBm as required in the US digital cellular system.

It is also possible to expand the dynamic range of the receiver with an AGC circuit by addition of a minimum circuitry and with no substantial increase of electric current.

As described above, the receiver with an AGC circuit according to this invention is normally operable when the input field strength is low. When the input field strength is increased, the low noise amplifier has a reduced gain because the bias voltage is interrupted. Accordingly, the dynamic range of the AGC amplifier is expanded while each of the mixer and the AGC amplifier is not saturated and produces the output signal free from distortion. Consequently, the demodulator is normally operable even if the input field strength is high. In addition, when the bias voltage is not supplied to the low noise amplifier, the input field strength indication signal is kept at a high level corresponding to the high input level. It is thus possible to avoid misjudgement that the input field strength is decreased.

What is claimed is:
1. A receiver comprising:
a demodulator;
an AGC circuit including:
a low noise amplifier for amplifying a reception input signal,
an AGC amplifier connected to said low noise amplifier for producing an amplified signal which is used as an input signal for said demodulator, and said AGC amplifier having a controlled gain so as to keep an average amplitude of said demodulator input signal at a constant level, and
detecting means connected to said low noise amplifier and supplied with an output signal of said low noise amplifier for detecting an input field strength to produce a strength indication signal indicative of said input field strength;
a bias control circuit connected to said detecting means, said bias control circuit including means for supplying a bias voltage from a bias voltage source to said low noise amplifier when said strength indication signal from said detecting means has a signal level lower than a predetermined first threshold level, for interrupting supply of said bias voltage when said signal level of said strength indication signal increasingly reaches said first threshold level, and for allowing supply of said bias voltage when said signal level of said strength indication signal is thereafter decreased to a predetermined second threshold level lower than said first threshold level; and
a level output circuit connected to said bias control circuit for keeping said strength indication signal at a predetermined high level when supply of said bias voltage is interrupted.
2. A receiver as claimed in claim 1, wherein said bias control circuit comprises:
comparator means connected to said detecting means and having said first and said second threshold levels for comparing said signal level of said strength indication signal with said first and said second threshold levels to produce a comparison result signal, said comparison result signal having a high level when said signal level of said strength indication signal is lower than said first threshold level, a low level when said signal level of said strength indication signal increases to said first threshold level, and a high level when said signal level of said strength indication signal is thereafter decreased to said second threshold level; and
a control circuit connected to said comparator means for controlling said bias voltage source to turn on to supply said bias voltage in response to said comparison result signal of a high level and for controlling said bias voltage source to turn off to interrupt said bias voltage in response to said comparison result signal of a low level.
3. A receiver as claimed in claim 2, wherein said bias control circuit further comprises:
a switching transistor connected to said bias voltage source and to said comparator means.
4. A receiver as claimed in claim 1, wherein said level output circuit comprises:
a diode having a cathode connected to an output side of said detecting means and an anode connected to said bias control circuit.

* * * * *